(12) United States Patent
Ashida et al.

(10) Patent No.: US 9,190,537 B2
(45) Date of Patent: Nov. 17, 2015

(54) MECHANICAL QUANTITY MEASURING DEVICE

(75) Inventors: Kisho Ashida, Tokyo (JP); Hiroyuki Ota, Tokyo (JP)

(73) Assignee: HITACHI, LTD., Tokyo (JP)

( * ) Notice: Subject to any disclaimer, the term of this patent is extended or adjusted under 35 U.S.C. 154(b) by 105 days.

(21) Appl. No.: 14/110,716

(22) PCT Filed: Apr. 21, 2011

(86) PCT No.: PCT/JP2011/059832
§ 371 (c)(1),
(2), (4) Date: Oct. 9, 2013

(87) PCT Pub. No.: WO2012/144048
PCT Pub. Date: Oct. 26, 2012

(65) Prior Publication Data
US 2014/0027868 A1 Jan. 30, 2014

(51) Int. Cl.
*G01L 1/04* (2006.01)
*H01L 29/84* (2006.01)
*G01B 7/16* (2006.01)
*G01L 1/18* (2006.01)
*G01L 1/26* (2006.01)
*G01L 19/14* (2006.01)

(52) U.S. Cl.
CPC *H01L 29/84* (2013.01); *G01B 7/16* (2013.01); *G01L 1/18* (2013.01); *G01L 1/26* (2013.01); *G01L 19/147* (2013.01)

(58) Field of Classification Search
CPC ....... G01L 19/147; G01L 9/0054; G01L 1/18; G05B 19/0423; H01L 2984/00
USPC ..................... 73/760, 777, 862.621
See application file for complete search history.

(56) References Cited

U.S. PATENT DOCUMENTS

| | | | |
|---|---|---|---|
| 6,347,040 B1* | 2/2002 | Fries et al. ............ | 361/760 |
| 2003/0001250 A1* | 1/2003 | Chien-Hung et al. ...... | 257/684 |
| 2003/0042587 A1* | 3/2003 | Lee .................. | 257/678 |
| 2009/0218668 A1* | 9/2009 | Zhe et al. ............ | 257/680 |

FOREIGN PATENT DOCUMENTS

| | | |
|---|---|---|
| JP | 6-174564 A | 6/1994 |
| JP | 2001-264188 A | 9/2001 |
| JP | 2002-139389 A1 | 5/2002 |
| JP | 2009-264976 A | 11/2009 |

\* cited by examiner

Primary Examiner — Max Noori
(74) Attorney, Agent, or Firm — Baker Botts L.L.P.

(57) ABSTRACT

In a mechanical quantity measuring device (1) having a sensor chip (2) which outputs a sense output (S) corresponding to a mechanical quantity acting on the object to be measured (4), and a flexible wiring board (3) which supports the sensor chip (2) and has a wire (6) to lead out the sense output (S) to outside, and in which in measuring the mechanical quantity, the sensor chip (2) and the flexible wiring board (3) are attached to the object to be measured (4), a cutout (5) is provided on the flexible wiring board (3) near the sensor chip (2) and on the side where the wire (6) is arranged for the sensor chip (2). Thus, change in the sense output (S) with time can be restrained.

23 Claims, 12 Drawing Sheets

MECHANICAL QUANTITY MEASURING DEVICE

TECHNICAL FIELD

The present invention relates to a mechanical quantity measuring device in which a sensor chip is supported on a flexible wiring board.

BACKGROUND ART

A mechanical quantity measuring device can be attached to an object to be measured and thus can measure a mechanical quantity acting on the object to be measured. As this mechanical quantity measuring device, a device which uses a sensor chip applying an effect of resistance that varies depending on the strain (piezoresistive effect) is proposed. An impurity diffused resistor is formed on a surface of this sensor chip and the sensor chip is attached to an object to be measured, with an adhesive. When a mechanical quantity acts on the object to be measured and the object to be measured is strained, the impurity diffused resistor is strained via the adhesive and the resistance thereof changes. Therefore, this change in resistance can be outputted as a sense output and the mechanical quantity (strain) acting on the object to be measured can be detected.

In order to achieve widespread use of this sensor chip, it is important that the sensor chip can be easily attached to an object to be measured and that a sense output can be taken out securely. In response to such demand, a mechanical quantity measuring device in which a sensor chip is deposited on a flexible wiring board having a wire and in which the sensor chip is electrically connected to the wire, is proposed (see PTL 1 and the like). By thus forming a module including the sensor chip and the flexible wiring board, the device can be easier to handle than in the case where the sensor chip is provided singly.

CITATION LIST

Patent Literature

PTL 1: JP-A-2001-264188

SUMMARY OF INVENTION

Technical Problem

In the conventional mechanical quantity measuring device, since the sensor chip is deposited on the flexible wiring board, not only the sensor chip but also the flexible wiring board around the sensor chip is attached to the object to be measured so that tension from an external wire connected to the flexible wiring board will not act on the sensor chip. In such a conventional mechanical quantity measuring device, the sense output may change with time in some cases.

Thus, an object of the invention is to provide a mechanical quantity measuring device capable of restraining change in sense output with time.

Solution to Problem

In order to achieve the foregoing object, according to the invention, a mechanical quantity measuring device includes a sensor chip which outputs a sense output corresponding to a mechanical quantity acting on the object to be measured, and a flexible wiring board which supports the sensor chip and has a wire to lead out the sense output to outside, and in measuring the mechanical quantity, the sensor chip and the flexible wiring board are attached to the object to be measured.

The mechanical quantity measuring device is characterized in that a cutout is provided on the flexible wiring board near the sensor chip and on the side where the wire is arranged for the sensor chip.

Advantageous Effect of Invention

According to the invention, a mechanical quantity measuring device capable of restraining change in sense output with time can be provided.

DESCRIPTION OF EMBODIMENTS

Figure 1A:
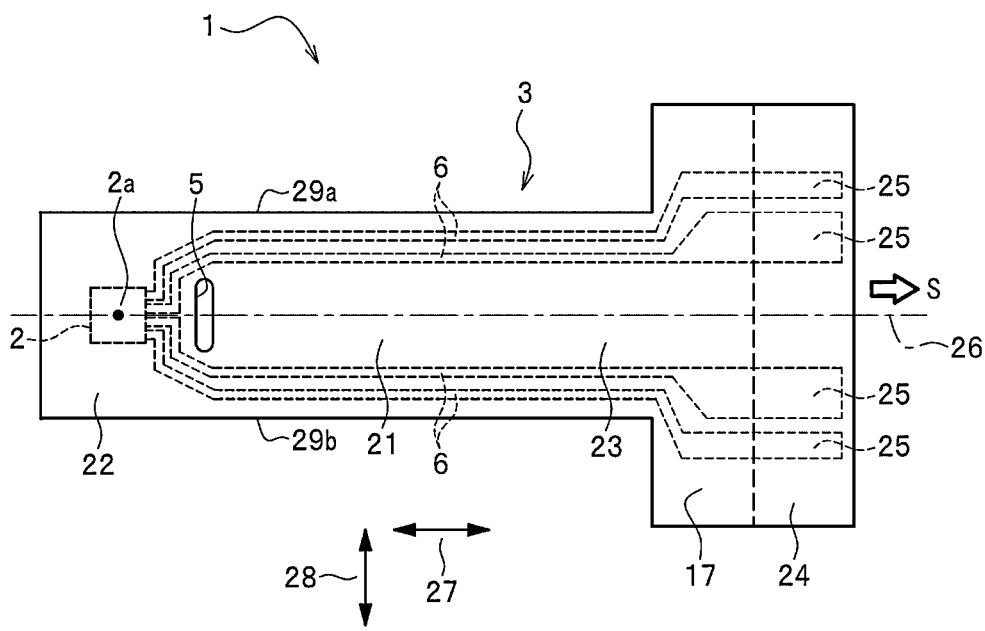
FIG. 1A is a plan view of a mechanical quantity measuring device according to a first embodiment of the invention.

In the following embodiments, explanation of the same or similar part will not be repeated in principle unless particularly necessary. Moreover, in the following embodiments, though the description will be divided into plural sections or embodiments when necessary for convenience, these sections or embodiments are not unrelated to each other and one may be a modification example, details, or supplementary explanation of a part or the whole of the other, unless otherwise stated. Also, in the following embodiments, when the numbers of elements or the like (including the numbers of elements, numeric values, quantities, ranges and the like) are mentioned, possible numbers are not limited to the specific numbers and may be equal to or greater than the specific numbers, or equal to or smaller than the specific numbers, unless otherwise stated or unless limitation to the specific numbers is theoretically obvious. Also, in the following embodiments, as a matter of course, components thereof are not necessarily essential unless otherwise stated or unless it is theoretically clear that the components are essential. Moreover, in the following embodiments, when the expressions "made up of A", "formed by A", "having A" and "including A" are used with respect to components or the like, as a matter of course, other components are not excluded unless it is clearly stated that only such components are used. Similarly, in the following embodiments, when shapes, positional relations and the like of components or the like are mentioned, substantially approximate or similar shapes and the like are included unless otherwise stated or unless it is theoretically clearly considered otherwise. This also applies the numeric values and ranges.

Hereinafter, embodiments of the invention will be described in detail, based on the drawings. Meanwhile, in all the drawings for explaining the embodiments, members having the same functions are denoted by the same reference numerals and repetitive explanation thereof is omitted. Also, the invention is not limited to each of the plural embodiments employed here and may properly combine those embodiments.

First Embodiment

FIG. 1A shows a plan view of a mechanical quantity measuring device 1 according to a first embodiment of the invention. The mechanical quantity measuring device 1 has a sensor chip 2 and a flexible wiring board 3 supporting the sensor chip 2. The sensor chip 2 can output a sense output S corresponding to a mechanical quantity acting on an object to be measured 4 (see FIG. 3).

The flexible wiring board 3 has a wire 6 and an external electrode 25 electrically connected to the wire 6. The wire 6 is electrically connected to the sensor chip 2 and leas out a sense output S from the sensor chip 2. The external electrode 25 outputs the sense output S from the wire 6 to outside.

Also, the flexible wiring board 3 has an arm portion 21 and a base portion 24 connected to the arm portion 21. The arm portion 21 supports the sensor chip 2 at a distal end part 22 thereof and is connected to the base portion 24 at a root part 23 thereof. The wire 6 is laid from the distal end part 22 to the root part 23 of the arm portion 21. In the base portion 24, the external electrode 25 connected to the wire 6 is provided. The flexible wiring board 3 is used in a number of semiconductor packaged products, utilizing its excellent flexibility. Also, the flexible wiring board can be reduced in thickness to 100 μm or below and enables reduction in size of the wiring portion and therefore is an essential component of a portable electronic device.

The flexible wiring board 3 is provided with a cutout (slit) 5. The cutout (slit) 5 is provided in the flexible wiring board 3 between the sensor chip 2 and the external electrode 25. The cutout (slit) 5 is provided in the flexible wiring board 3 near the sensor chip 2 and on the side where the wire 6 is arranged for the sensor chip 2. The cutout 5 is provided on the side of the external electrode 25 with respect to the sensor chip 2, in a longitudinal direction 27 of the arm portion 21 that is a direction from the distal end part 22 toward the root part 23 of the arm portion 21. A longitudinal direction 28 of the cutout 5 intersects the longitudinal direction 27 of the arm portion 21 substantially at right angles. The longitudinal direction 28 of the cutout 5 intersects, substantially at right angles, a center line 26 of the arm portion 21 that is parallel to the longitudinal direction 27 of the arm portion 21. Meanwhile, the cutout 5 can be produced by punching with a metal press mold, similarly to the formation of the outer shape of the flexible wiring board 3, and therefore is not a factor that increases cost.

The sensor chip 2 is arranged in such away that a center point 2a thereof is situated on the center line 26 of the arm portion 21. Also, the sensor chip 2 is arranged with line symmetry about the center line 26 of the arm portion 21.

As the wire 6, plural wires (in the example of FIG. 1A, four wires) are laid. The plural wires 6 are drawn to detour around the cutout 5. The plural wires 6 are arranged with line symmetry to each other about the center line 26 of the arm portion 21.

Meanwhile, on the face side of the mechanical quantity measuring device 1 (flexible wiring board 3), a base film 17 is exposed almost across the entire surface.

Figure 1B:
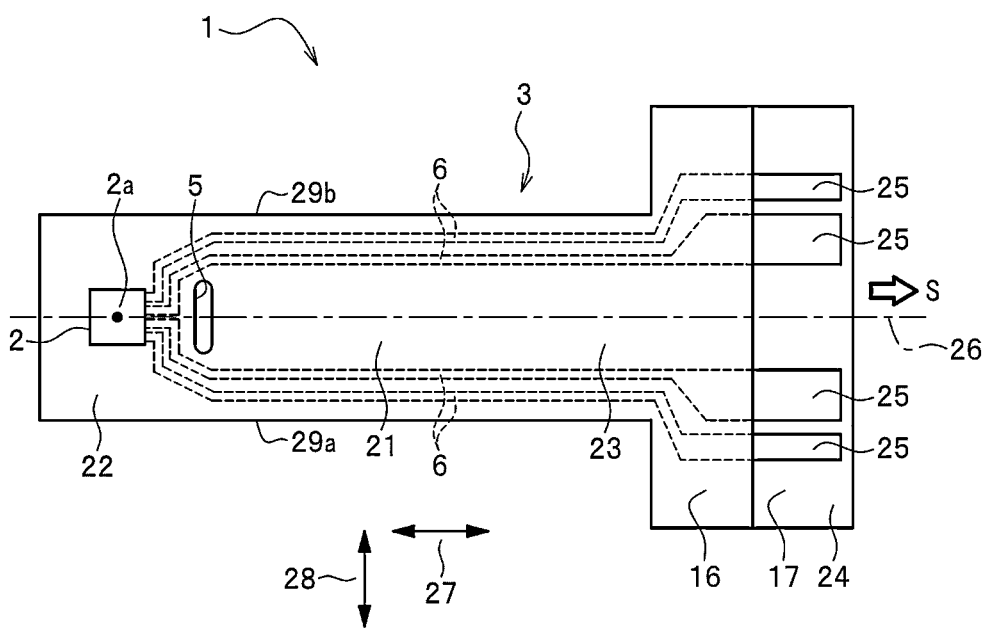
FIG. 1B is a bottom view of the mechanical quantity measuring device according to the first embodiment of the invention.

FIG. 1B shows a bottom view of the mechanical quantity measuring device 1 according to the first embodiment of the invention. The sensor chip 2 is supported on the back side of the flexible wiring board 3. The wires 6 are formed below the base film 17 and are also covered with an insulating film 16. That is, the wires 6 are covered with the base film 17 from the face side of the flexible wiring board 3 and are covered with the insulating film 16 from the back side of the flexible wiring board 3. The external electrode 25 is formed below the base film 17. The lower side of the external electrode 25 is exposed, instead of being covered with the insulating film 16, and is connectable to an external device.

Figure 2:
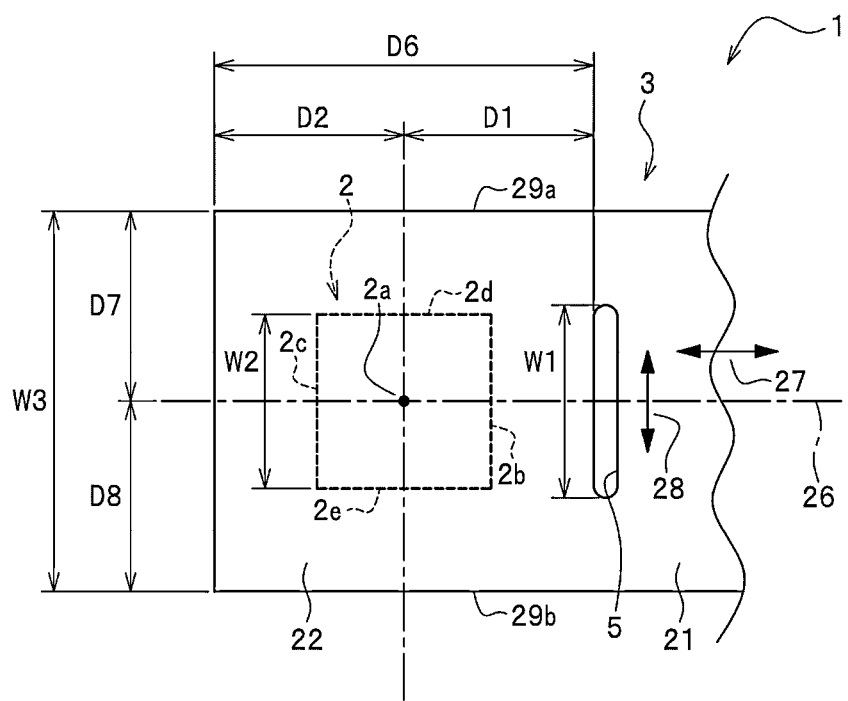
FIG. 2 is an enlarged view of FIG. 1A around a sensor chip in the mechanical quantity measuring device according to the first embodiment of the invention.

FIG. 2 shows an enlarged view around the sensor chip 2 in the mechanical quantity measuring device 1 according to the first embodiment of the invention. Both ends in the longitudinal direction 28 of the cutout 5 are arcuate. The cutout 5 is line-symmetrical about the center line 26 parallel to the longitudinal direction 27 of the arm portion 21. A width W1 of the cutout 5 in the direction intersecting the longitudinal direction 27 of the arm portion 21 substantially at right angles is bisected by the center line 26 of the arm portion 21. The width W1 of the cutout 5 in the direction intersecting the longitudinal direction 27 of the arm portion 21 substantially at right angles is substantially equal to or greater than a width W2 of the sensor chip 2 in the direction intersecting the longitudinal direction 27 of the arm portion 21 substantially at right angles (W1≥W2).

The center point 2a of the sensor chip 2 is arranged on the center line 26 parallel to the longitudinal direction 27 of the arm portion 21. A distance D7 from a lateral side 29a of the flexible wiring board 3 along the longitudinal direction 27 of the arm portion 21 to the center point 2a of the sensor chip 2 is substantially equal to a distance D8 from a lateral side 29b of the flexible wiring board 3 along the longitudinal direction 27 of the arm portion 21 to the center point 2a of the sensor chip 2 (D7=D8).

The sensor chip 2 is substantially square, as viewed in a plan view. A side 2b is arranged facing the cutout 5. A side 2c is arranged parallel to and facing the end side on the distal end part 22 of the arm portion 21. A side 2d is arranged parallel to and facing the lateral side 29a of the flexible wiring board 3 along the longitudinal direction 27 of the arm portion 21. A side 2e is arranged parallel to and facing the lateral side 29b of the flexible wiring board 3 along the longitudinal direction 27 of the arm portion 21. The side 2b of the sensor chip 2 that faces the cutout 5 intersects the center line 26 of the arm portion 21 substantially at right angles. The longitudinal direction 28 of the cutout 5 intersects the longitudinal direction 27 (center line 26) of the arm portion 21 substantially at right angles. Then, the longitudinal direction 28 of the cutout 5 is arranged parallel to the side 2b.

A distance D1 from the cutout 5 to the center point 2a of the sensor chip 2 is substantially equal to a distance D2 from the end side of the flexible wiring board 3 opposite to the cutout 5 with respect to the sensor chip 2 to the center point 2a of the sensor chip 2 (D1=D2). A distance D6 from the cutout 5 to the end side of the flexible wiring board 3 opposite to the external electrode 25 with respect to the cutout 5 is substantially equal to a width W3 of the arm portion 21 in the direction intersecting the longitudinal direction 27 of the arm portion 21 substantially at right angles at the center point 2a of the sensor chip 2 (D6=W3). The distance D1 from the cutout 5 to the center point 2a of the sensor chip 2 is substantially equal to the distance D7 from the lateral side 29a to the center point 2a of the sensor chip 2 and the distance D8 from the lateral side 29b to the center point 2a of the sensor chip 2 (D1=D7=D8). The distance D1 from the cutout 5 to the center point 2a of the sensor chip 2 is substantially equal to half the width W3 of the arm portion 21 in the direction intersecting the longitudinal direction 27 of the arm portion 21 substantially at right angles at the center point 2a of the sensor chip 2.

Also, in the first embodiment, while an example of the sensor chip 2 that is square as viewed in a plan view is described, its shape is not limited to this and may be, for example, rectangular or circle as long as the center point 2a can be decided.

Figure 3:
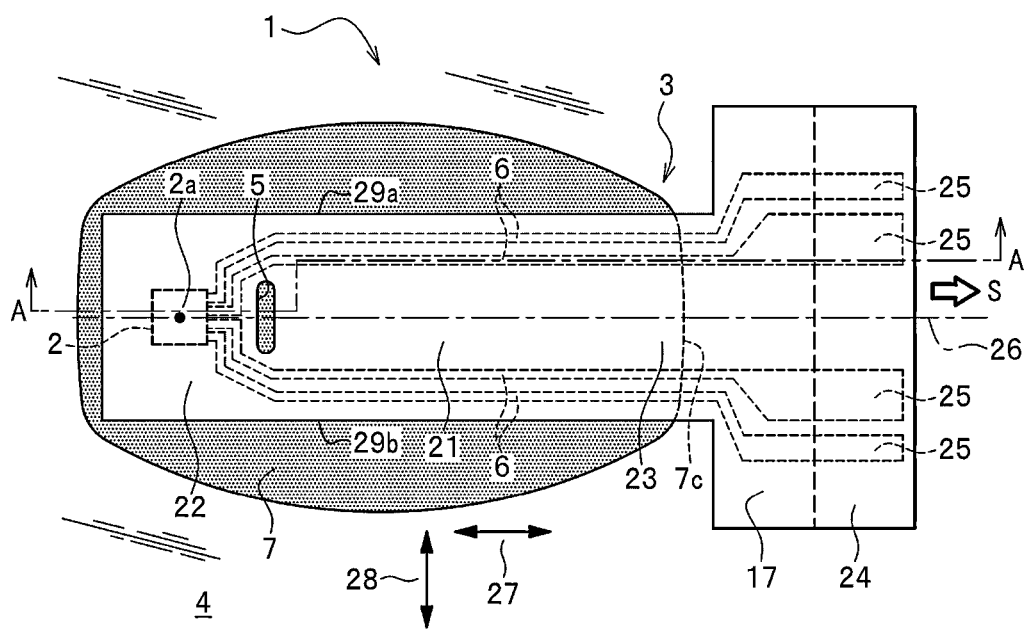
FIG. 3 is a plan view where the mechanical quantity measuring device according to the first embodiment of the invention is attached to an object to be measured, with an adhesive.

FIG. 3 shows the state where the mechanical quantity measuring device 1 according to the first embodiment of the invention is attached to an object to be measured 4 with an adhesive 7. In the mechanical quantity measuring device 1, when measuring a mechanical quantity, the sensor chip 2 and the flexible wiring board 3 are attached to the object to be measured 4 with the adhesive 7. The adhesive 7 is applied not only to the distal end part 22 of the arm portion 21 around the sensor chip 2 but also to an area from the distal end part 22 of the arm portion 21 to the vicinity of the root part 23. An adhesive end surface 7c of the adhesive 7 reaches the vicinity of the root part 23 of the arm portion 21. The adhesive 7 is not applied to the base portion 24 of the flexible wiring board 3. Even when an external wire from an external device is connected to the external electrode 25 and tension from the external wire acts on the external electrode 25, the action of tension on the sensor chip 2 is restrained because the flexible wiring board 3 between the external electrode 25 and the sensor chip 2 is attached to the object to be measured 4. By the way, as the adhesive 7, a two-component or single-component epoxy resin adhesive or the like may be used.

Figure 4:
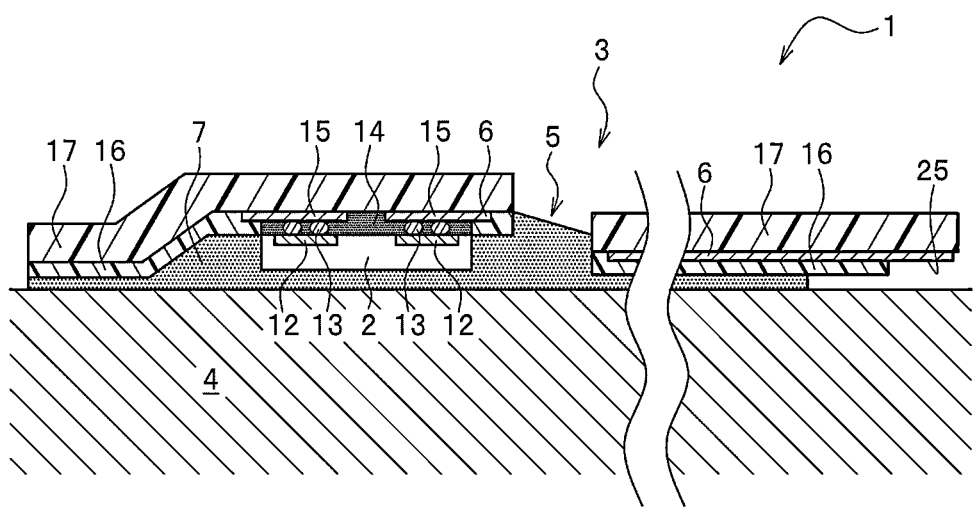
FIG. 4 is an enlarged sectional view taken along arrows A-A in FIG. 3.

FIG. 4 shows an enlarged view of essential parts of a sectional view taken along arrows A-A in FIG. 3. Plural electrode pads (on the chip side) 12 are formed on the surface of the sensor chip 2. On the back side of the base film 17 opposite the plural electrodes pads 12, plural electrode pads (on the flexible wiring board side) 15 are formed. The plural electrode pads 15 are connected to the wires 6. The electrode pads (on the chip side) 12 and the electrode pads (on the flexible wiring board side) 15 are connected to each other with bumps 13 such as gold bumps. The area between the sensor chip 2 and the flexible wiring board 3 except the bumps 13 is filled with an underfill material 14. In this way, the sensor chip 2 is attached to and supported on the flexible wiring board 3 with the bumps 13 and particularly with the underfill material 14. An epoxy resin can be used as the underfill material 14. The underfill material 14 is used for the purpose of preventing a short circuit between the bumps 13 and between the electrode pads 12, 15, protecting the surface of the sensor chip 2, and reinforcing the bonding force between the flexible wiring board 3 and the sensor chip 2.

In the flexible wiring board 3, the wires 6 are formed on the back side of the base film 17, and the insulating film 16 is formed under the wires 6. The flexible wiring board 3 has a sandwich structure in which the wires 6 are sandwiched between the base film 17 and the insulating film 16.

Figure 5A:
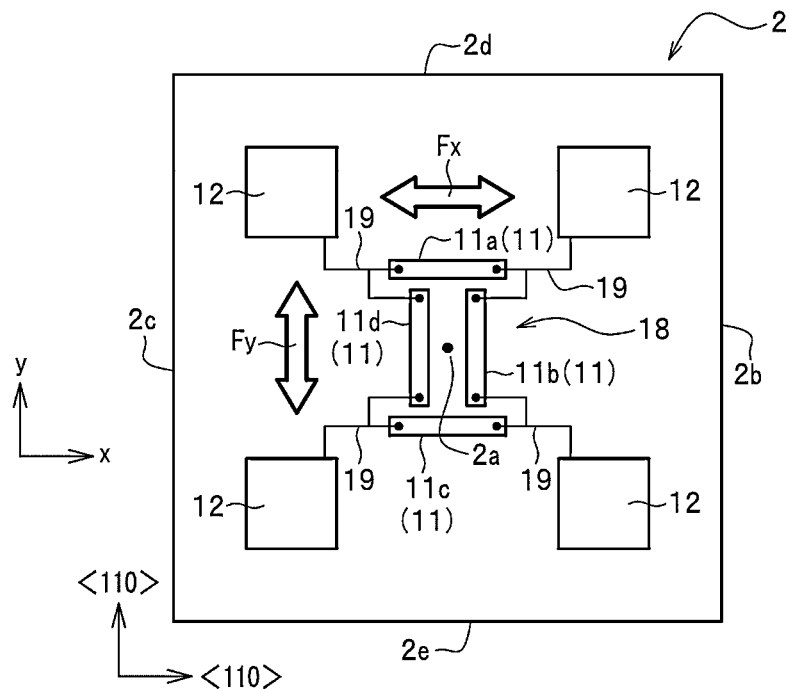
FIG. 5A is a plan view of an example of a sensor chip (part 1).

FIG. 5A shows a plan view of an example of the sensor chip 2 (part 1). As the sensor chip 2, a semiconductor substrate, particularly, a silicon (Si) single-crystal substrate with a (100) surface can be used. On the sensor chip 2 (semiconductor substrate), four piezoresistive elements 11 (11a, 11b, 11c, 11d) are formed. The piezoresistive elements 11 are impurity diffused resistors formed on the surface of the semiconductor substrate. The conduction type of the piezoresistive elements (impurity diffused resistors) 11 is p-type. The direction in which a current flows in the piezoresistive elements 11 is the longitudinal direction of the piezoresistive elements 11. The longitudinal direction of the piezoresistive elements 11 is the direction of crystal orientation <110> of the semiconductor substrate. Then, the longitudinal directions of the piezoresistive elements 11 (11a, 11c) are an x-axis direction (direction parallel to the sides 2d, 2e). The longitudinal directions of the piezoresistive elements 11 (11b, 11d) are a y-axis direction intersecting the x-axis direction at right angles (direction parallel to the sides 2b, 2c). The four piezoresistive elements 11 (11a, 11b, 11c, 11d) are connected to each other with in-chip wires 19 and thus form a Wheatstone bridge circuit 18. The four electrode pads (on the chip side) 12 are connected to the in-chip wires 19. According to such a sensor chip 2, a sense output S corresponding to the mechanical quantity of the difference between a strain (mechanical quantity) Fx in the x direction and a strain (mechanical quantity) Fy in the y direction can be outputted with high sensitivity.

Meanwhile, in order to amplify the sense output S, it is possible to form an amplifier circuit on the surface of the sensor chip 2 forming the Wheatstone bridge circuit 18. All of the Wheatstone bridge circuit 18, the amplifier circuit and the like formed on the sensor chip can be produced using a normal semiconductor manufacturing process. Therefore, refinement is easy and the manufacturing cost can be reduced.

Also, since the sensor chip 2 outputs the sense output S corresponding to the mechanical quantity of the difference between the strain (mechanical quantity) Fx in the x direction and the strain (mechanical quantity) Fy in the y direction, even if the ambient temperature changes at the time of strain measurement and heat strain dependent on the difference in the coefficient of linear expansion between the sensor chip 2 and the object to be measured 4 occurs, the heat strains in the x direction and in the y direction have equal values and therefore can be canceled. That is, with the use of the sensor chip 2, there is no need to worry about change in strain values due to change in ambient temperature.

Figure 8:
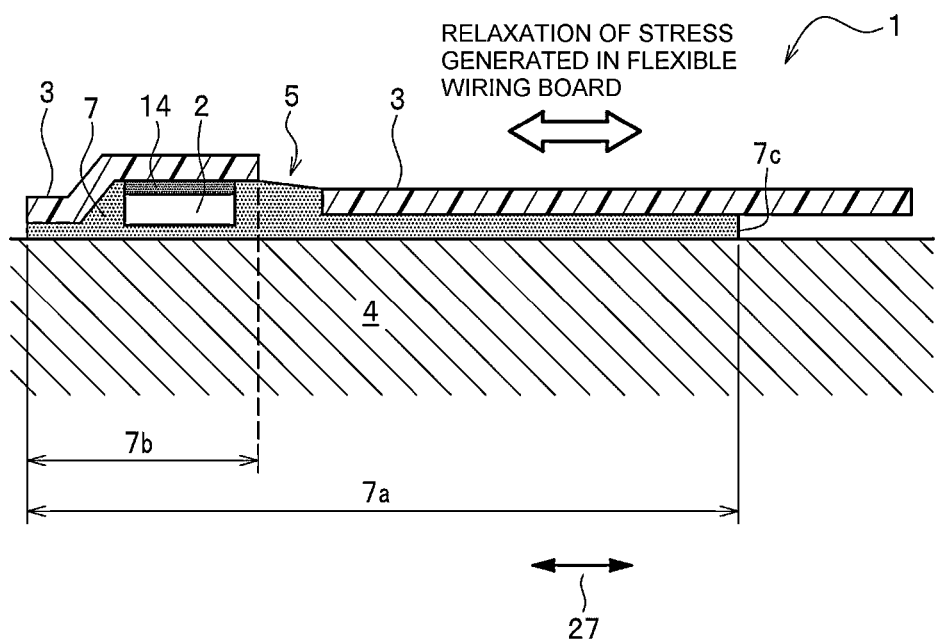
FIG. 8 is a schematic sectional view taken along arrows A-A in FIG. 3.

Also, as described with reference to FIG. 2, the distance D6 from the cutout 5 to the end side and the width W3 of the arm portion 21 are substantially equal (D6=W3). Therefore, the size of a substantial adhering area 7b, described in the explanation of FIG. 8, is equal in the x direction and in the y direction of the sensor chip 2. Since stress to be relaxed is equal in the x direction and in the y direction of the sensor chip 2, the stress to be relaxed can be canceled, as in the case of change in ambient temperature.

Figure 5B:
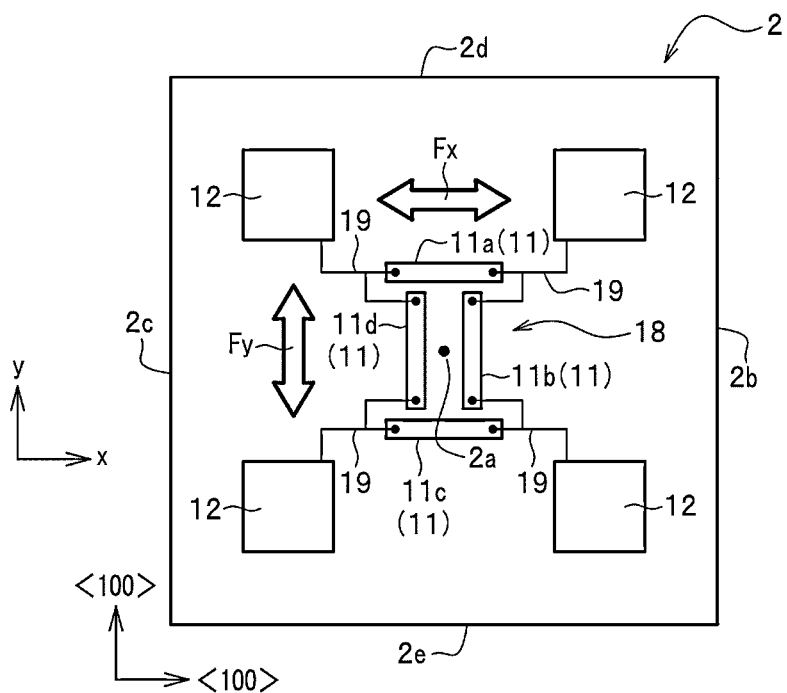
FIG. 5B is a plan view of an example of a sensor chip (part 2).

FIG. 5B shows a plan view of an example of the sensor chip 2 (part 2). The example of the sensor chip 2 (part 2) is different from the example of the sensor chip 2 (part 1) in that the conduction type of the piezoresistive elements (impurity diffused resistors) 11 is n-type. Accordingly, the longitudinal direction of the piezoresistive elements 11 is the direction of crystal orientation <100> of the semiconductor substrate. Also with such a sensor chip 2, a sense output S corresponding to the mechanical quantity of the difference between a strain (mechanical quantity) Fx in the x direction and a strain (mechanical quantity) Fy in the y direction can be outputted with high sensitivity.

Figure 6:
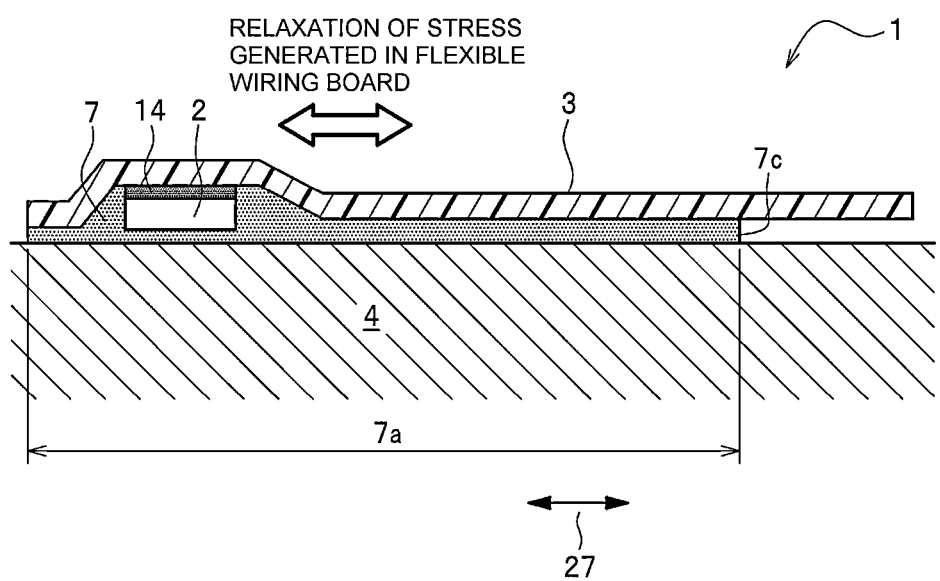
FIG. 6 is a sectional view of a conventional mechanical quantity measuring device.

FIG. 6 shows a sectional view of a conventional mechanical quantity measuring device. The inventors in this application find that the reason for change in sense output with time in the conventional mechanical quantity measuring device is that strain generated in the flexible wiring board 3 is relaxed with time. When a tensile strain is generated in the object to be measured 4, a tensile strain is also generated in the flexible wiring board 3 attached to the object to be measured 4 and stress occurs there. When a test is carried out in which the flexible wiring board 3 is made of a resin material such as polyimide or epoxy resin and in which a predetermined strain is applied to the resin material (flexible wiring board 3), stress relaxation occurs in such a manner that stress generated in the resin material (flexible wiring board 3) decreases with the lapse of time.

Figure 7:
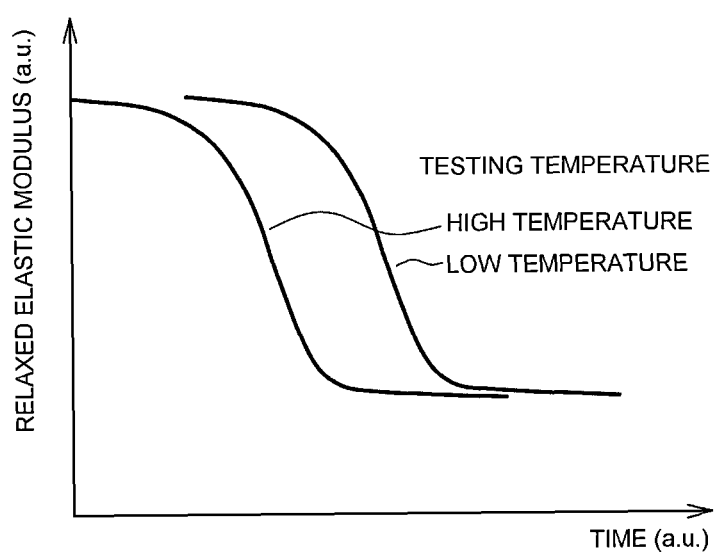
FIG. 7 is a graph showing change in relaxed elastic modulus with time, in order to explain a stress relaxation phenomenon in a flexible wiring board.

FIG. 7 shows change with time in the relaxed elastic modulus of the resin material (flexible wiring board 3). It can be seen that the relaxed elastic modulus falls with the lapse of time. Even if a constant tensile strain is generated in the flexible wiring board 3 irrespective of time, as the relaxed elastic modulus falls, stress as the product of the tensile strain (quantity) and the relaxed elastic modulus falls and stress relaxation takes place. By the way, the relaxed elastic modulus falls earlier as the testing temperature (temperature of the resin material) is higher.

As shown in FIG. 6, when the stress generated in the flexible wiring board 3 (resin material) is relaxed, the strain state of the object to be measured 4 with the flexible wiring board 3 attached thereto changes and the strain state of the sensor chip 2, supported on the flexible wiring board 3 and attached to the object to be measured 4, changes. That is, the stress relaxation in the flexible wiring board 3 results in change in the sense output S from the sensor chip 2. Then, the amount of change in this sense output S increases as an adhering area 7a of the adhesive 7 attaching the flexible wiring board 3 to object to be measured 4 is greater.

FIG. 8 schematically shows a sectional view taken along arrows A-A in FIG. 3. Even in the mechanical quantity measuring device 1 of the first embodiment, the size of the adhering area 7a of the adhesive 7 attaching the flexible wiring board 3 to the object to be measured 4 is the same as in the conventional mechanical quantity measuring device. However, since the cutout 5 is provided, the adhering area that causes change in the sense output S is substantially the adhering area 7b and is considered smaller than in the conventional example. Therefore, change in the sense output S is successfully restrained. Also, even when an external wire from an external device is connected to the external electrode 25 (see FIG. 3) and tension from the external wire acts on the flexible wiring board 3 with the external electrode 25 formed thereon, the provision of the cutout 5 causes the tension to detour, instead of going straight through the flexible wiring board 3, to act on the sensor chip 2. Therefore, the influence of the tension on the sensor chip 2 can be restrained. Also, even though the cutout 5 is provided, the size of the adhering area 7a of the adhesive 7 attaching the flexible wiring board 3 to the object to be measured 4 is not much smaller than in the conventional example. The tension does not cause detachment of the flexible wiring board 3 and reliability of connection can be secured. Moreover, since the adhesive 7 in the cutout 5 rises and become fixed along the sidewalls of the flexible wiring board 3, a so-called anchor effect enables the flexible wiring board 3 to be firmly attached to the object to be measured 4.

Also, as described with reference to FIG. 2, since the distance D6 from the cutout 5 to the end side and the width W3 of the arm portion 21 are substantially equal (D6=W3), the size of the substantial adhering area 7b which causes change in the sense output S is equal in the x direction and in the y direction of the sensor chip 2 (see FIG. 5A). As stress to be relaxed is equal in the x direction and in the y direction of the sensor chip 2, the sense output S in which the stress to be relaxed is canceled can be outputted.

Second Embodiment

Figure 9:
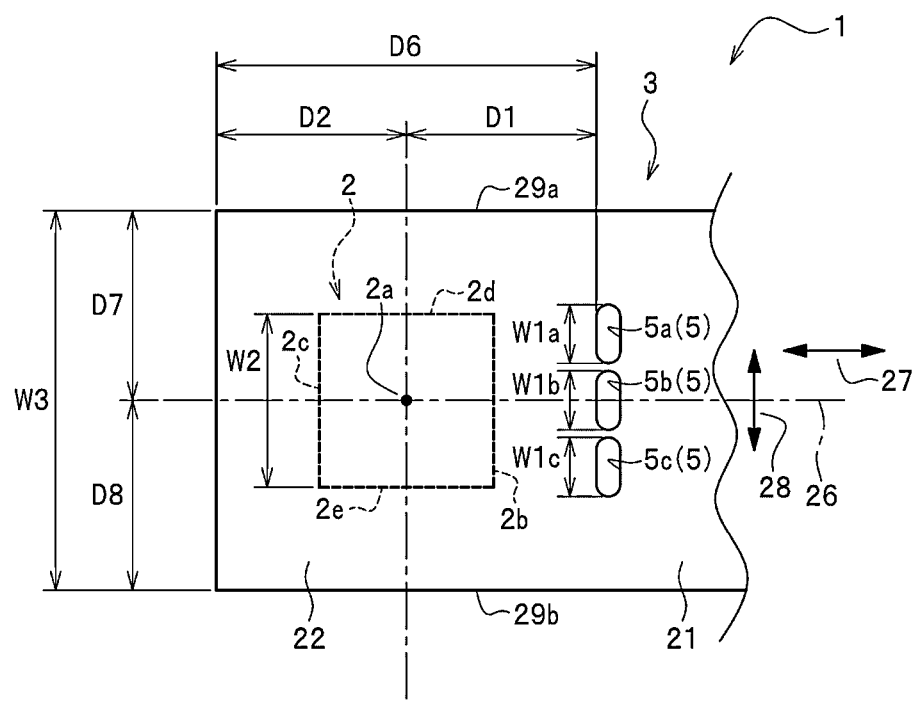
FIG. 9 is an enlarged view around a sensor chip in a mechanical quantity measuring device according to a second embodiment of the invention.

FIG. 9 shows an enlarged view around a sensor chip 2 in a mechanical quantity measuring device 1 according to a second embodiment of the invention. The mechanical quantity measuring device 1 according to the second embodiment is different from the mechanical quantity measuring device 1 according to the first embodiment in that the cutout 5 is divided into plural parts. FIG. 9 shows an example of the cutout 5 divided into three cutouts 5a, 5b, 5c. Both ends in the longitudinal direction 28 of the cutouts 5a, 5b, 5c are arcuate. The cutouts 5a, 5b, 5c are arranged in a line in the longitudinal direction 28 of the cutout 5. The longitudinal direction of the cutouts 5a, 5b, 5c is substantially coincident with the longitudinal direction 28 of the cutout 5. The cutout 5 (5a, 5b, 5c) is line-symmetrical about the center line 26 parallel to the longitudinal direction 27 of the arm portion 21. Specifically, the cutout 5b is line-symmetrical about the center line 26. A width W1b of the cutout 5b in the direction intersecting the longitudinal direction 27 of the arm portion 21 substantially at right angles is bisected by the centerline 26. The cutout 5a and the cutout 5c are line-symmetrical to each other about the center line 26. A width W1a of the cutout 5a in the direction intersecting the longitudinal direction 27 of the arm portion 21 substantially at right angles is substantially equal to a width W1c of the cutout 5c in the direction intersecting the longitudinal direction 27 of the arm portion 21 substantially at right angles (W1a=W1c). According to the second embodiment, not only the advantages of the first embodiment can be achieved but also the degree of freedom in designing the wires 6 can be improved because the wires 6 (see FIG. 1A) can not only detour the cutout 5 but also pass between the cutouts 5a, 5b, 5c.

Third Embodiment

Figure 10:
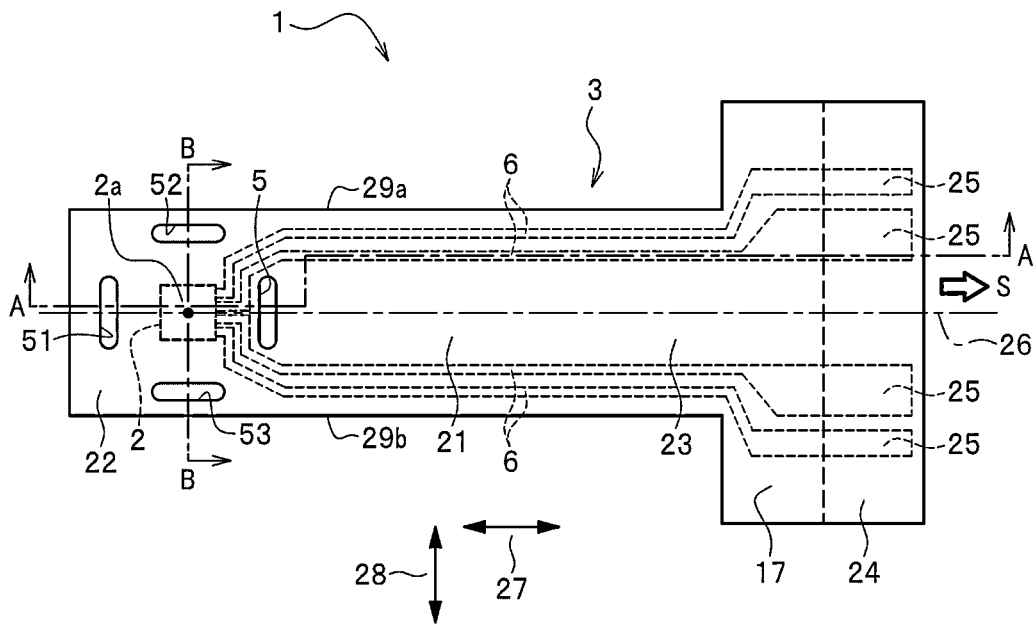
FIG. 10 is a plan view of a mechanical quantity measuring device according to a third embodiment of the invention.

FIG. 10 shows a plan view of a mechanical quantity measuring device 1 according to a third embodiment of the invention. The mechanical quantity measuring device 1 according to the third embodiment is different from the mechanical quantity measuring device 1 according to the first embodiment in that a first separate cutout 51, a second separate cutout 52 and a third separate cutout 53 are provided in flexible wiring board 3 in addition to the cutout 5.

The first separate cutout 51 is provided opposite to cutout 5 with respect to the sensor chip 2 on the flexible wiring board 3. Of the two sides on the sensor chip 2 in the longitudinal direction 27 of the arm portion 21, the cutout 5 is arranged on one side and the first separate cutout 51 is arranged on the other.

The second separate cutout 52 is provided between one lateral side 29a of the two sides opposite each other of the flexible wiring board 3 along the longitudinal direction 27 of the arm portion 21, and the sensor chip 2.

The third separate cutout 53 is provided between the other lateral side 29b of the two sides opposite each other of the flexible wiring board 3 along the longitudinal direction 27 of the arm portion 21, and the sensor chip 2. Of the two sides on the sensor chip 2 in the direction intersecting the longitudinal direction 27 of the arm portion 21 at right angles, the second separate cutout 52 is arranged on one side and the third separate cutout 53 is arranged on the other.

Figure 11:
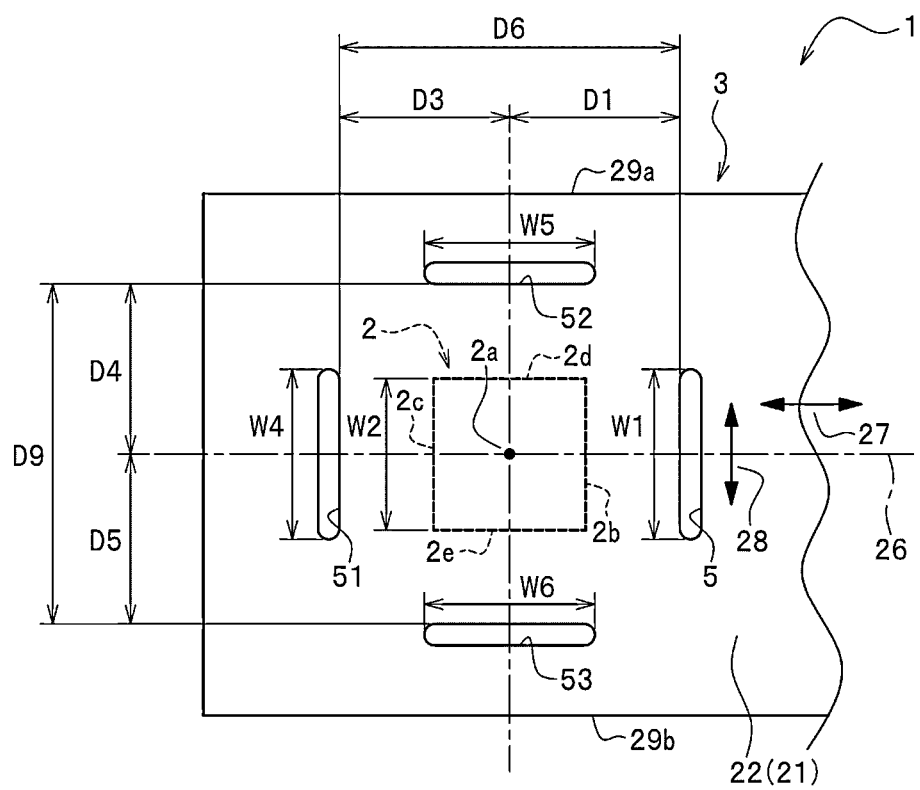
FIG. 11 is an enlarged view of FIG. 10 around a sensor chip in the mechanical quantity measuring device according to the third embodiment.

FIG. 11 shows the state around the sensor chip 2 in the mechanical quantity measuring device 1 according to the third embodiment. The cutout 5 faces the side 2b of the sensor chip 2. The longitudinal direction of the cutout 5 is substantially parallel to the side 2b. The width W1 of the cutout 5 in the longitudinal direction is substantially equal to or greater than the length (width) W2 of the side 2b (W1≥W2).

The first separate cutout 51 faces the side 2c of the sensor chip 2. The longitudinal direction of the first separate cutout 51 is substantially parallel to the side 2c. A width W4 of the first separate cutout 51 in the longitudinal direction is substantially equal to or greater than the length (width) of the side 2c (=W2) (W4≥W2). The width W4 is substantially equal to the width W1 of the cutout 5 in the longitudinal direction (W4=W1).

The second separate cutout 52 faces the side 2d of the sensor chip 2. The longitudinal direction of the second separate cutout 52 is substantially parallel to the side 2d. A width W5 of the second separate cutout 52 in the longitudinal direction is substantially equal to or greater than the length (width) of the side 2d (=W2) (W5≥W2).

The third separate cutout 53 faces the side 2e of the sensor chip 2. The longitudinal direction of the third separate cutout 53 is substantially parallel to the side 2e. A width W6 of the third separate cutout 53 in the longitudinal direction is substantially equal to or greater than the length (width) of the side 2e (=W2) (W6≥W2). The width W6 is substantially equal to the width W5 of the second separate cutout 52 in the longitudinal direction (W6=W5). The width W5 and the width W6 are substantially equal to the width W1 of the cutout 5 in the longitudinal direction (W5=W6=W1).

A distance D3 from the first separate cutout 51 to the center point 2a of the sensor chip 2 is substantially equal to the distance D1 from the cutout 5 to the center point 2a of the sensor chip 2 (D3=D1). A distance D4 from the second separate cutout 52 to the center point 2a of the sensor chip 2 is substantially equal to a distance D5 from the third separate cutout 53 to the center point 2a of the sensor chip (D4=D5). Also, the distance D4 and the distance D5 are substantially equal to the distance D1 (D4=D5=D1). The distance D6 from the cutout 5 to the first separate cutout 51 is substantially equal to a distance D9 from the second separate cutout 52 to the third separate cutout 53 (D6=D9).

Figure 12:
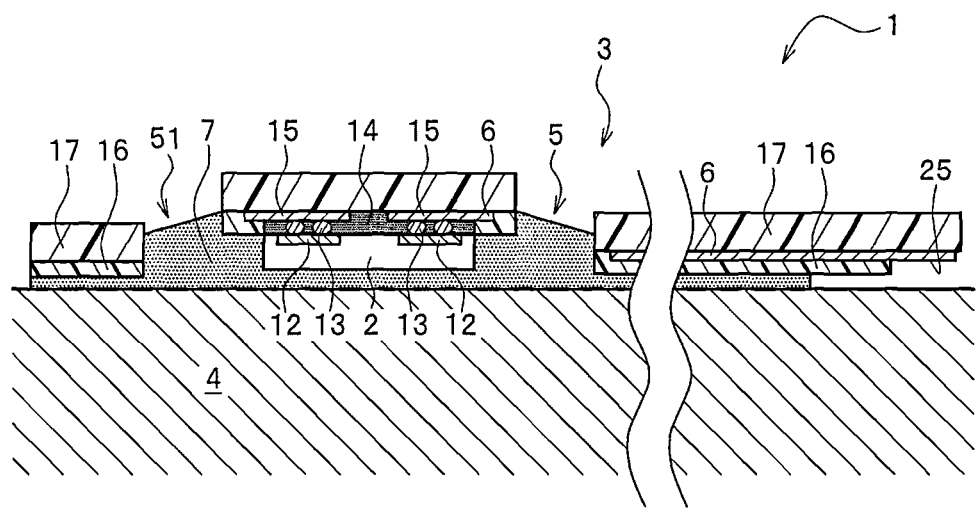
FIG. 12 is a sectional view corresponding to a section taken along arrows A-A in FIG. 10 in the case where the mechanical quantity measuring device is attached to an object to be measured, with an adhesive, around the sensor chip and around an external electrode in the mechanical quantity measuring device according the third embodiment of the invention.

FIG. 12 shows a sectional view around the sensor chip 2 and around the external electrode 25 in the mechanical quantity measuring device 1 according to the third embodiment of the invention in the case where the mechanical quantity measuring device 1 is attached to the object to be measured 4 with the adhesive 7. The section in the sectional view of FIG. 12 corresponds to a section taken along arrows A-A in FIG. 10. The first separate cutout 51 is provided opposite the cutout 5 with respect to the sensor chip 2 on the flexible wiring board 3. Of the two sides on the sensor chip 2 in the longitudinal direction 27 of the arm portion 21, the cutout 5 is arranged on one side and the first separate cutout 51 is arranged on the other. Since the cutouts 5, 51 are provided on both sides of the sensor chip 2, symmetry is increased and stress acting on the sensor chip 2 from the flexible wiring board 3 can be uniform. Particularly, in the cutout 5 and the first separate cutout 51, the adhesive 7 rises and becomes fixed along the sidewalls of the flexible wiring board 3. Therefore, a so-called anchor effect from the two sides enables firm and uniform attachment of the flexible wiring board 3 to the object to be measured 4 at the position supporting the sensor chip 2.

Figure 13:
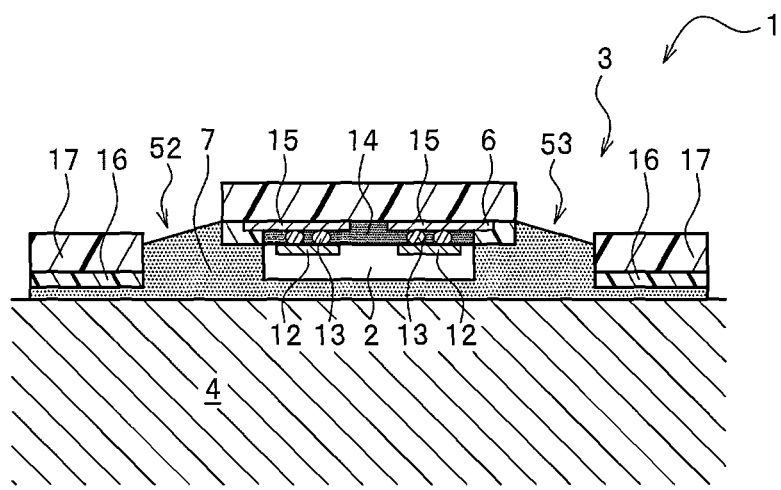
FIG. 13 is a sectional view corresponding to a section taken along arrows B-B in FIG. 10 in the case where the mechanical quantity measuring device is attached to an object to be measured, with an adhesive, around the sensor chip in the mechanical quantity measuring device according to the third embodiment of the invention.

FIG. 13 shows a sectional view around the sensor chip 2 in the mechanical quantity measuring device 1 according to the third embodiment of the invention in the case where the mechanical quantity measuring device 1 is attached to the object to be measured 4 with the adhesive 7. The section in the sectional view of FIG. 13 corresponds to a section taken along arrows B-B in FIG. 10. Of the two sides on the sensor chip 2 in the direction intersecting the longitudinal direction 27 of the arm portion 21 at right angles, the second separate cutout 52 is arranged on one side and the third separate cutout 53 is arranged on the other. Since the cutouts 52, 53 are provided on both sides of the sensor chip 2, symmetry is increased and stress acting on the sensor chip 2 from the flexible wiring board 3 can be uniform. Particularly, in the second separate cutout 52 and the third separate cutout 53, the adhesive 7 rises and becomes fixed along the sidewalls of the flexible wiring board 3. Therefore, a so-called anchor effect from the two sides enables firm and uniform attachment of the flexible wiring board 3 to the object to be measured 4 at the position supporting the sensor chip 2.

Figure 14:
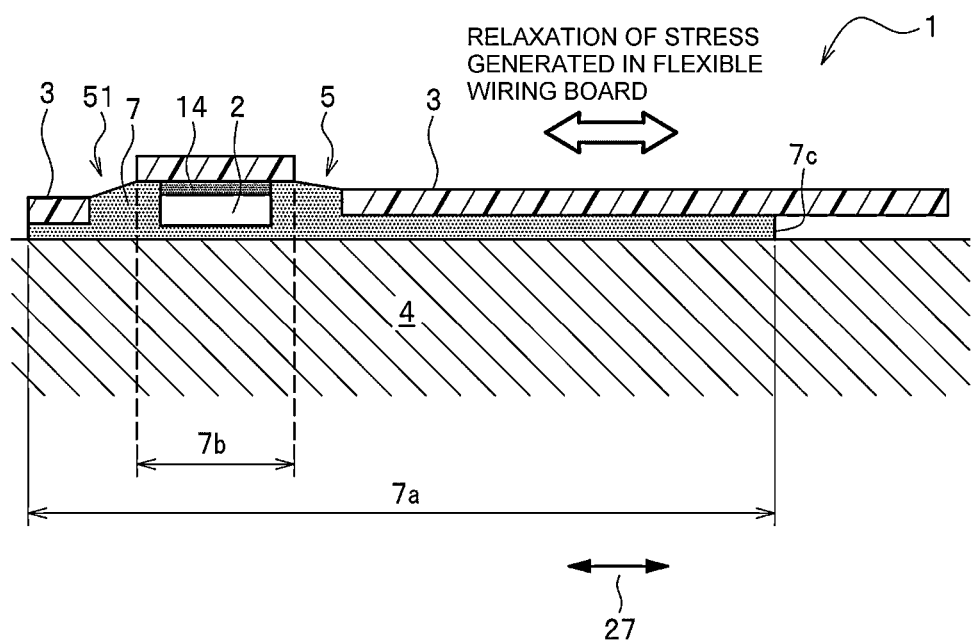
FIG. 14 is a schematic sectional view corresponding to a section taken along arrows A-A in FIG. 10 in the case where the mechanical quantity measuring device according to the third embodiment of the invention is attached to an object to be measured, with an adhesive.

FIG. 14 schematically shows a sectional view in the case where the mechanical quantity measuring device 1 according to the third embodiment of the invention is attached to the object to be measured 4 with the adhesive 7. The section in the sectional view of FIG. 14 corresponds to a section taken along arrows A-A in FIG. 10. Even in the mechanical quantity measuring device 1 according to the third embodiment, the size of the adhering area 7a of the adhesive 7 attaching the flexible wiring board 3 to the object to be measured 4 is the same as in the conventional mechanical quantity measuring device (see FIG. 6). However, since the cutout 5 and the first separate cutout 51 (second separate cutout 52, third separate cutout 53) are provided, the adhering area that causes change in the sense output S is substantially the adhering area 7b and is considered smaller than in the conventional example. Therefore, change in the sense output S is successfully restrained. In this way, the third embodiment can achieve similar advantages to the first embodiment. In the third embodiment, the cutout 5 and the first separate cutout 51 (second separate cutout 52, third separate cutout 53) can be easily made closer to the sensor chip 2 and the substantial adhering area 7b that causes change in the sense output S can be made smaller than in the first embodiment without reducing the adhering area 7a.

Also, as described with reference to FIG. 11, the distance D6 from the cutout 5 to the first separate cutout 51 is substantially equal to the distance D9 from the second separate cutout 52 to the third separate cutout 53 (D6=D9). Therefore, the size of the substantial adhering area 7b that causes change in the sense output S is equal in the x direction and in the y direction of the sensor chip 2 (see FIG. 5A). Since stress to be relaxed is equal in the x direction and in the y direction of the sensor chip 2, the sense output S in which the stress to be relaxed is canceled can be outputted.

Fourth Embodiment

Figure 15:
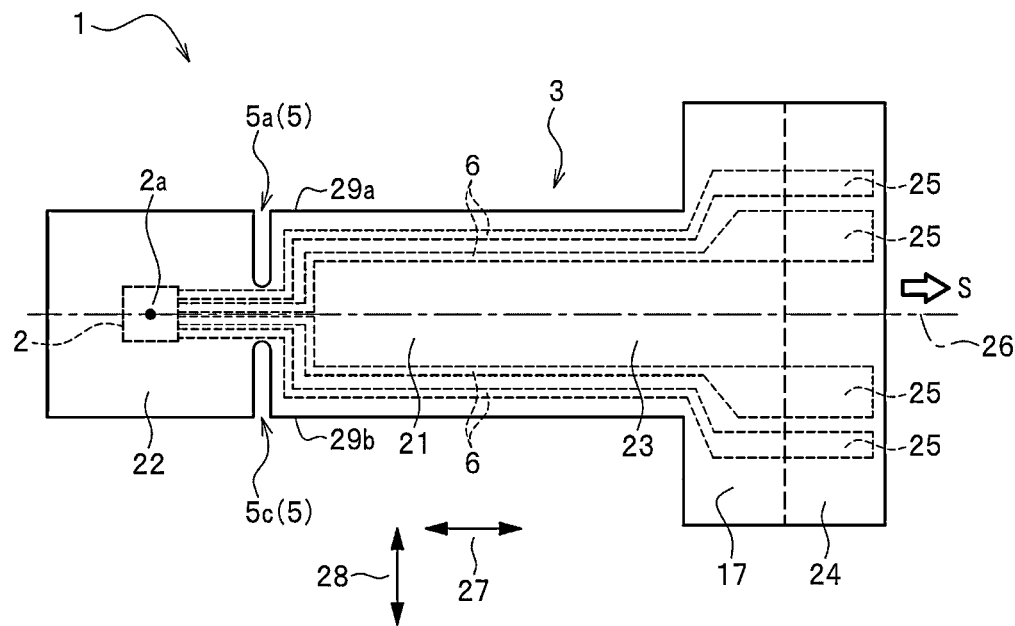
FIG. 15 is a plan view of a mechanical quantity measuring device according to a fourth embodiment of the invention.
Figure 16:
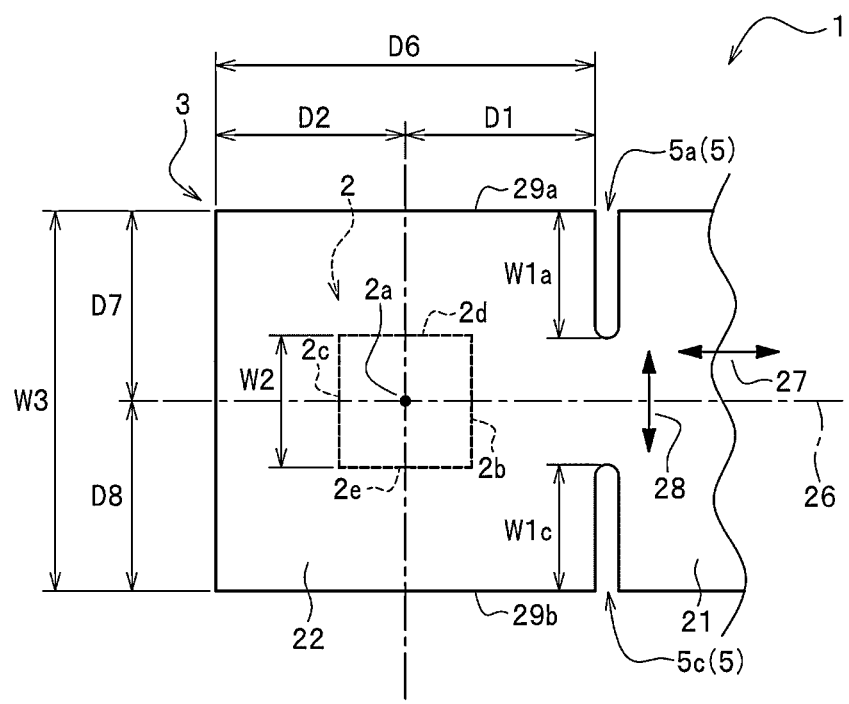
FIG. 16 is an enlarged view of FIG. 15 around a sensor chip in the mechanical quantity measuring device according to the fourth embodiment of the invention.

FIG. 15 shows a plan view of a mechanical quantity measuring device 1 according to a fourth embodiment of the invention. FIG. 16 shows an enlarged view around the sensor chip 2 of the mechanical quantity measuring device 1. In the mechanical quantity measuring device 1 according to the fourth embodiment, the cutout 5 is divided into plural cutouts, as in the mechanical quantity measuring device 1 according to the second embodiment. However, the mechanical quantity measuring device 1 according to the fourth embodiment is different from the mechanical quantity measuring device 1 according to the second embodiment in that the divided cutouts 5a and 5c reach the lateral sides 29a and 29b of the flexible wiring board 3. As for this point, it can also be considered that the flexible wiring board is cut into from the lateral sides 29a, 29b, thus forming the cutouts 5a, 5c on the lateral sides 29a, 29b.

One-side ends of the cutouts 5a, 5c in the longitudinal direction 28 are arcuate. The cutouts 5a, 5c are arranged in a line along the longitudinal direction 28 of the cutout 5. The longitudinal directions of the cutouts 5a, 5c are substantially coincident with the longitudinal direction 28 of the cutout 5. The cutouts 5a, 5c are line-symmetrical to each other about the center line 26 parallel to the longitudinal direction 27 of the arm portion 21. The width W1a of the cutout 5a in the direction intersecting the longitudinal direction 27 of the arm portion 21 substantially at right angles is substantially equal to the width W1c of the cutout 5c in the direction intersecting the longitudinal direction 27 of the arm portion 21 substantially at right angles (W1a=W1c). According to the fourth embodiment, the wires 6 (see FIG. 1A) can pass between the cutout 5a and the cutout 5c without detouring around the cutout 5. Therefore, the degree of freedom in designing the wires 6 can be improved, as in the second embodiment.

REFERENCE SIGNS LIST 1 mechanical quantity measuring device
2 sensor chip
2a center point of sensor chip
2b, 2c, 2d, 2e lateral sides of sensor chip
3 flexible wiring board
4 object to be measured
5 cutout
5a, 5b, 5c plural divided cutouts
6 wire
7 adhesive
7a, 7b adhering area
7c adhering end surface
11, 11a, 11b, 11c, 11d piezoresistive element
12 electrode pad (chip side)
13 bump
14 underfill material
15 electrode pad (flexible wiring board side)
16 insulating film
17 base film
18 Wheatstone bridge circuit
19 in-chip wire
21 arm portion
22 distal end part
23 root part
24 base portion
25 external electrode
26 center line of arm portion
27 longitudinal direction of arm portion
28 longitudinal direction of cutout
29a, 29b lateral side of flexible wiring board
51 first separate cutout
52 second separate cutout
53 third separate cutout
D1 to D9 distance
Fx strain (mechanical quantity) in x direction
Fy strain (mechanical quantity) in y direction
W1 to W6 width
S sense output

The invention claimed is:

1. A mechanical quantity measuring device having a sensor chip which outputs a sense output corresponding to a mechanical quantity acting on an object to be measured,
and a flexible wiring board which supports the sensor chip at a first area on a first side of the flexible wiring board, the flexible wiring board having a wire arranged for the sensor chip on the first side to lead out the sense output to outside, and in which in measuring the mechanical quantity, the sensor chip and the flexible wiring board are attached to the object to be measured, wherein
the mechanical quantity measuring device has a cutout provided at a second area on the first side where the wire is arranged for the sensor chip,
the second area being an area of the first side of the flexible wiring board that does not overlap the first area, and
the wire being arranged so as not to cross the second area.

2. The mechanical quantity measuring device according to claim 1, characterized in that the flexible wiring board has an arm portion which supports the sensor chip at a distal end part thereof and in which the wire is laid from the distal end part to a root part thereof, and a base portion which has an external electrode connected to the wire and is connected to the arm portion at the root part, and
the cutout is provided on the side of the external electrode with respect to the sensor chip in a longitudinal direction of the arm portion directed from the distal end part toward the root part.

3. The mechanical quantity measuring device according to claim 2, characterized in that a longitudinal direction of the cutout intersect the longitudinal direction of the arm portion substantially at right angles.

4. The mechanical quantity measuring device according to claim 2, characterized in that a longitudinal direction of the cutout intersects, substantially at right angles, a center line of the arm portion parallel to the longitudinal direction of the arm portion.

5. The mechanical quantity measuring device according to claim 4, characterized in that a center point of the sensor chip is arranged on the center line of the arm portion, and a side of the sensor chip that faces the cutout intersects the center line of the arm portion substantially at right angles.

6. The mechanical quantity measuring device according to claim 1, characterized in that a distance from the cutout to a center point of the sensor chip is substantially equal to a distance from an end of the flexible wiring board that is opposite to the cutout with respect to the sensor chip and the center point of the sensor chip.

7. The mechanical quantity measuring claim 2, characterized in that the cutout is line-symmetrical about the center line of the arm portion.

8. The mechanical quantity measuring device according to claim 7, characterized in that each of the sensor chip and the wire is arranged with line symmetry about the center line of the arm portion.

9. The mechanical quantity measuring device according to claim 2, characterized in that a width of the cutout in a direction intersecting the longitudinal direction of the arm portion substantially at right angles is bisected by the center line of the arm portion.

10. The mechanical quantity measuring device according to claim 2, characterized in that a distance from the cutout to a center point of the sensor chip is substantially equal to half a width of the arm portion in a direction intersecting the longitudinal direction of the arm portion substantially at right angles at the center point of the sensor chip.

11. The mechanical quantity measuring device according to claim 2, characterized in that a distance from the cutout to an end of the flexible wiring board that is opposite to the external electrode with respect to the cutout is substantially equal to a width of the arm portion in a direction intersecting the longitudinal direction of the arm portion substantially at right angles at a center point of the sensor chip.

12. The mechanical quantity measuring device according to claim 7, characterized in that the cutout is divided into plural cutouts.

13. The mechanical quantity measuring device according to claim 12, characterized in that one of the plural divided cutouts reaches one of two sides of the flexible wiring board that are opposite each other along the longitudinal direction of the arm portion, and another of the plural divided cutouts reaches the other of the two sides of the flexible wiring board that are opposite each other along the longitudinal direction of the arm portion.

14. The mechanical quantity measuring device according to claim 1, characterized in that a piezoresistive element is formed in the sensor chip.

15. The mechanical quantity measuring device according to claim 1, characterized in that an electrode pad is formed in the sensor chip, the electrode pad and the wire are connected to each other with a bump, and an area between the sensor chip and the flexible wiring board except the bump is filled with an underfill material.

16. The mechanical quantity measuring device according to claim 1, characterized in that a first separate cutout that is different from the cutout is provided on the opposite side to the cutout with respect to the sensor chip on the flexible wiring board.

17. The mechanical quantity measuring device according to claim 16, characterized in that a distance from the first separate cutout to a center point of the sensor chip is substantially equal to a distance from the cutout to the center point of the sensor chip.

18. The mechanical quantity measuring device according to claim 2, characterized by having a second separate cutout provided between one of two sides of the flexible wiring board that are opposite each other along the longitudinal direction of the arm portion and the sensor chip, the second separate cutout facing the sensor chip and being different from the cutout, and a third separate cutout provided between the other of the two sides of the flexible wiring board that are opposite each other along the longitudinal direction of the arm portion and the sensor chip, the third separate cutout facing the sensor chip and being different from the cutout and the second separate cutout.

19. The mechanical quantity measuring device according to claim 18, characterized in that a distance from the second separate cutout to a center point of the sensor chip, and a distance from the third separate cutout to the center point of the sensor chip are substantially equal to a distance from the cutout to the center point of the sensor chip.

20. The mechanical quantity measuring device according to claim 2, characterized in that a width of the cutout in a direction intersecting the longitudinal direction of the arm portion substantially at right angles is substantially equal to or greater than a width of the sensor chip in the direction intersecting the longitudinal direction of the arm portion substantially at right angles.

21. The mechanical quantity measuring device according to claim 16, characterized in that a width of the first separate cutout in a direction intersecting the longitudinal direction of the arm portion substantially at right angles is substantially equal to a width of the cutout in the direction intersecting the longitudinal direction of the arm portion substantially at right angles.

22. The mechanical quantity measuring device according to claim 18, characterized in that a width of the second separate cutout in the longitudinal direction of the arm portion, and a width of the third separate cutout in the longitudinal direction of the arm portion are substantially equal to a width of the cutout in a direction intersecting the longitudinal direction of the arm portion substantially at right angles.

23. The mechanical quantity measuring device according to claim 1, characterized in that at least one of two ends of the cutout in the longitudinal direction is arcuate.

* * * * *